United States Patent
Movassaghi et al.

(10) Patent No.: US 11,177,620 B2
(45) Date of Patent: Nov. 16, 2021

(54) LASER FAILURE EARLY WARNING INDICATOR

(71) Applicant: Intel Corporation, Santa Clara, CA (US)

(72) Inventors: Mahan Movassaghi, Menlo Park, CA (US); Rohit Mittal, Sunnyvale, CA (US); Robert W. Herrick, San Jose, CA (US); Jen-Chyun Chen, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 897 days.

(21) Appl. No.: 15/705,584

(22) Filed: Sep. 15, 2017

(65) Prior Publication Data

US 2019/0089110 A1    Mar. 21, 2019

(51) Int. Cl.
| | |
|---|---|
| *H01S 5/00* | (2006.01) |
| *H01S 3/10* | (2006.01) |
| *H01S 3/00* | (2006.01) |
| *H01S 5/068* | (2006.01) |
| *H01S 5/06* | (2006.01) |

(52) U.S. Cl.
CPC ........ *H01S 3/0014* (2013.01); *H01S 3/10069* (2013.01); *H01S 5/0021* (2013.01); *H01S 5/06825* (2013.01); *H01S 5/0617* (2013.01); *H01S 5/06804* (2013.01); *H01S 5/06808* (2013.01)

(58) Field of Classification Search
CPC .. H01S 3/0014; H01S 5/0021; H01S 5/06825; H01S 3/10069; H01S 5/06808; H01S 5/06804; H01S 5/0617
See application file for complete search history.

(56) References Cited

U.S. PATENT DOCUMENTS

| | | | |
|---|---|---|---|
| 6,195,370 B1 | 2/2001 | Haneda et al. | |
| 9,916,850 B1* | 3/2018 | Chu | G11B 5/012 |
| 2004/0161248 A1* | 8/2004 | Stewart | H04B 10/504 |
| | | | 398/196 |
| 2009/0192735 A1* | 7/2009 | Horiuchi | H01S 5/0021 |
| | | | 702/58 |
| 2013/0083636 A1 | 4/2013 | Kotani et al. | |
| 2018/0181454 A1* | 6/2018 | Lin | G06F 11/073 |

* cited by examiner

*Primary Examiner* — Xinning(Tom) Niu
(74) *Attorney, Agent, or Firm* — Schwabe, Williamson & Wyatt, P.C.

(57) ABSTRACT

In embodiments, an apparatus to predict failure of a laser is presented. The apparatus may include a memory to store a reference model of bias current change for a laser as a function of time and temperature, one or more sensors to detect: temperature, elapsed operating time and bias current of the laser, and a processor communicatively coupled to the memory and to the one or more sensors. The processor may be to calculate an actual bias current change ΔIA at a current laser temperature, and an expected bias current change ΔIE, based at least in part on the reference model and an average operating temperature, subtract ΔIE from ΔIA, and if the difference is greater than a pre-defined value α, output a signal. Related methods and non-transitory computer-readable media may also be presented.

14 Claims, 9 Drawing Sheets

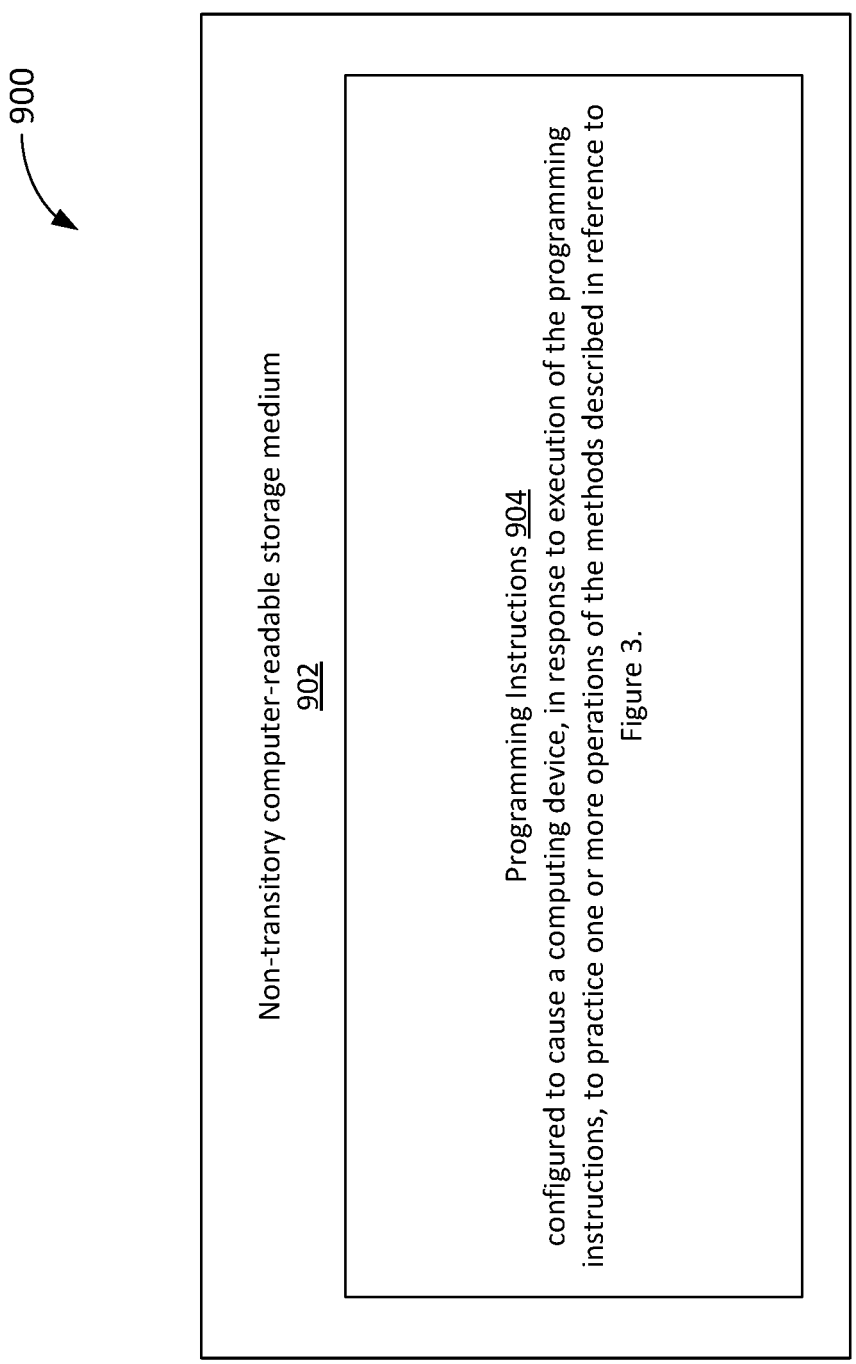

LASER FAILURE EARLY WARNING INDICATOR

TECHNICAL FIELD

The present disclosure relates to the field of optical communication modules, and in particular, to a system and method for a laser failure early warning indicator

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

In laser based optical systems, laser failure may be the most likely cause of system failure. Conventionally, a warning flag may be raised when laser current passes a certain threshold. This can often be inaccurate as both overestimating or underestimating an impending failure. In many cases passing an arbitrary current threshold does not mean that the laser is about to fail. For example, at high temperatures, laser current typically increases significantly. For a warning flag tied to an arbitrary current threshold, such a warning flag may be set without the laser actually being even close to failure. On the other hand, for rapidly degrading lasers a warning flag which may be set at an arbitrary maximum laser current may not give adequate time for a user to replace the module before laser failure occurs. This may especially be true for lasers with a non-linear degradation profile.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 9 illustrates an example computer-readable storage medium having instructions configured to practice aspects of the process of FIG. 3, in accordance with various embodiments.

DETAILED DESCRIPTION

In embodiments, an abnormal change in laser bias current may be used to detect an early indication of laser failure, and signal a user as to the condition. Thus, in embodiments, an apparatus to predict laser failure may be provided. The apparatus may include a memory to store a reference model of bias current (I_bias) change for a laser as a function of time and temperature. In embodiments the reference model may provide a relation between I_bias and aging time for an arbitrary operating temperature.

Figure 1:
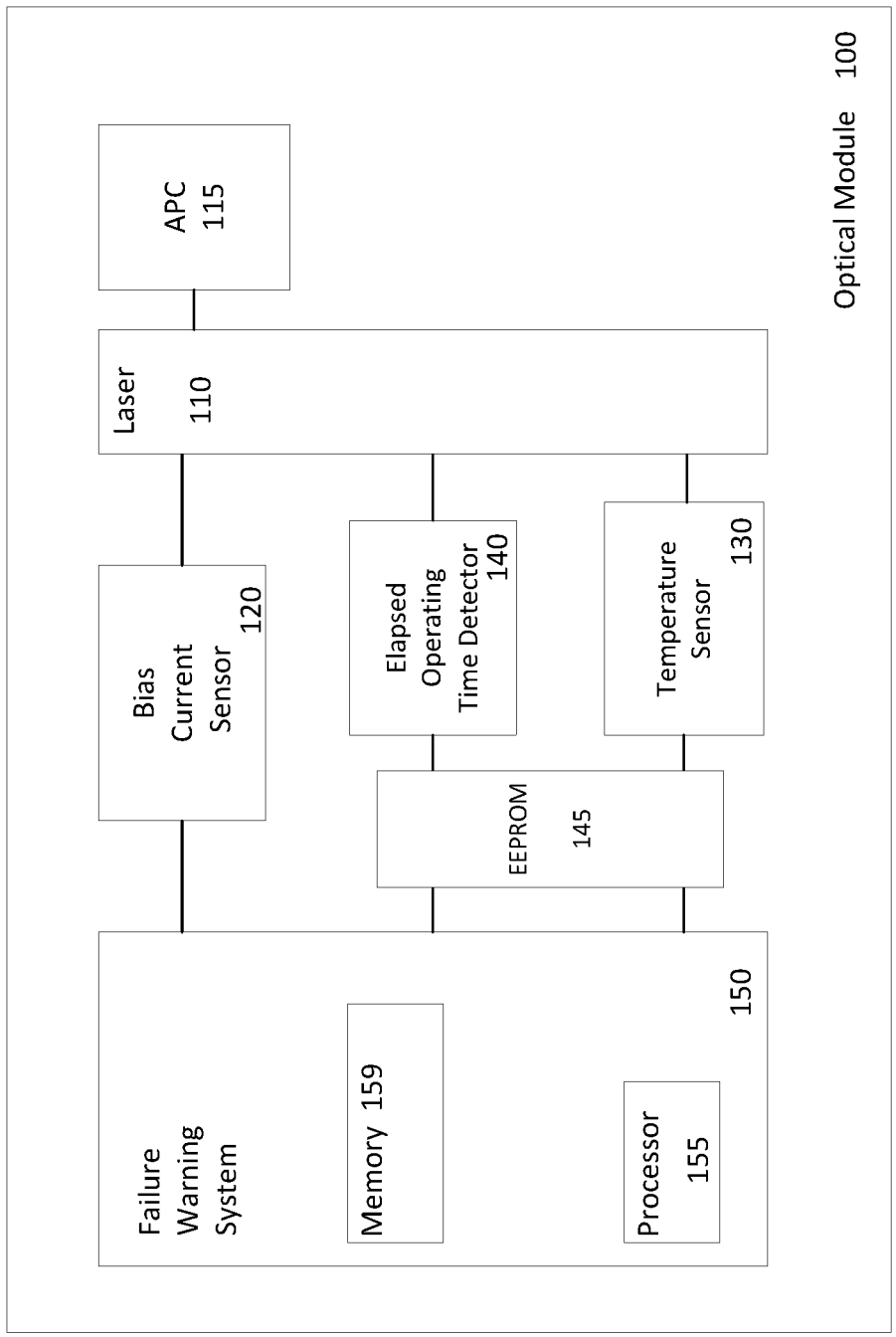
FIG. 1 illustrates an example optical module in accordance with various embodiments.
Figure 2:
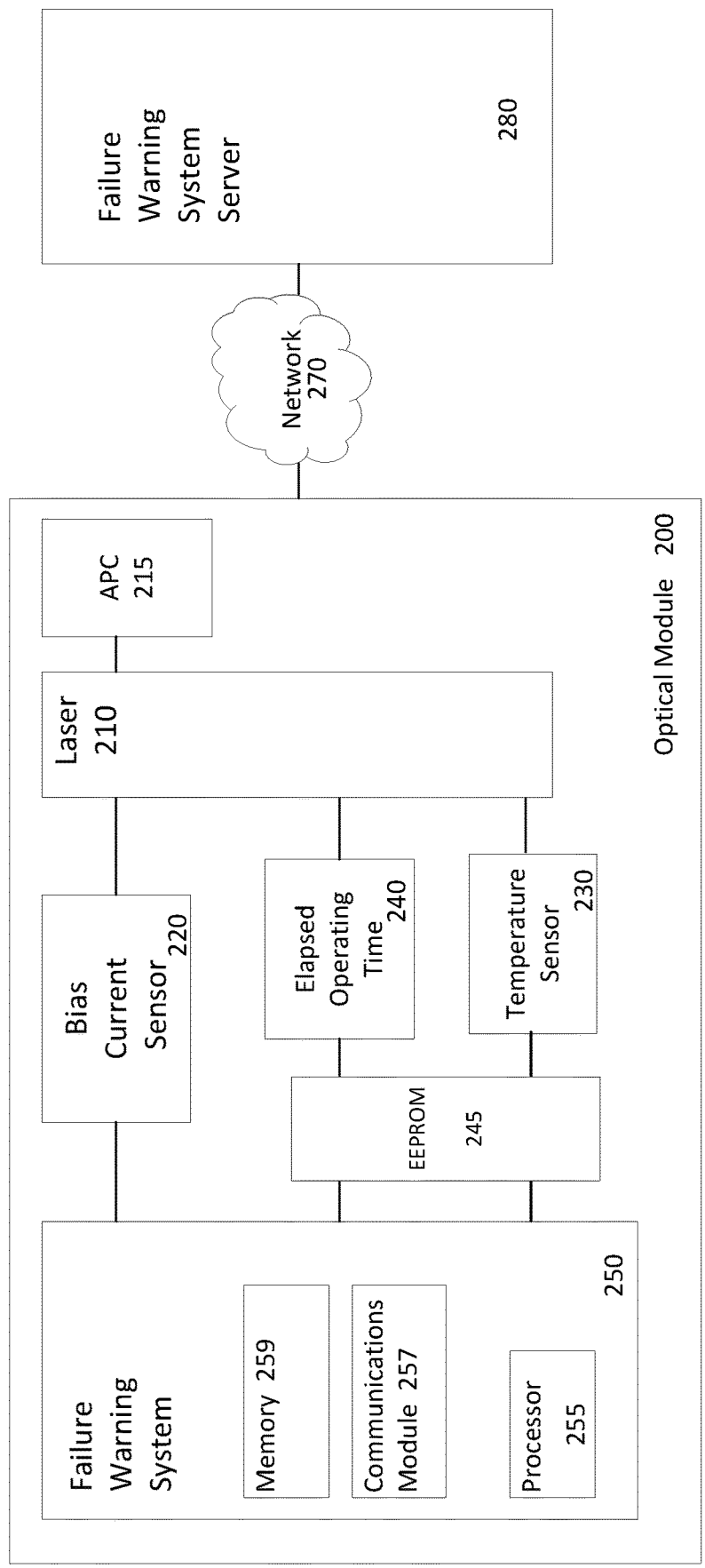
FIG. 2 illustrates an alternate example optical module in accordance with various embodiments.

In embodiments, the reference model may be created from reliability stress tests, and may be stored in a memory provided in the apparatus. In embodiments the memory may be provided in a failure warning system. In embodiments, the apparatus may be provided in an optical module, such as is illustrated in FIG. 1 or 2, described below.

In embodiments, the apparatus may further include one or more sensors to detect temperature, elapsed operating time and bias current of the laser, and a processor communicatively coupled to the memory and to the one or more sensors. The processor may be provided in a failure warning system, which may comprise a micro-controller, or a System-on-Chip (SOC). The processor may calculate an actual bias current change $\Delta IA$ at a current laser temperature, and an expected bias current change $\Delta IE$, based at least in part on an average operating temperature and the reference model. In embodiments, the processor may subtract $\Delta IE$ from $\Delta IA$, and determine if the difference exceeds a pre-defined value $\alpha$, which may be set at manufacture, or may programmable by a user of the apparatus. In embodiments, the processor may further output a failure warning signal if the difference exceeds $\alpha$. In embodiments, $\Delta IE$ and $\Delta IA$ may be relative to an initial I_bias current, which may also be stored at the time of manufacture in a memory of the apparatus. In embodiments, the memory may be an electrically erasable programmable read-only memory (EEPROM), which is a type of non-volatile memory used in computers and other electronic devices to store relatively small amounts of data, but which allows individual bytes to be erased and reprogrammed.

In the description to follow, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" may refer to, be part of, or include an Application Specific Integrated Circuit (ASIC), an electronic circuit, a programmable combinational logic circuit (such as field programmable gate array (FPGA)), a processor (shared, dedicated, or group) and/or memory (shared, dedicated, or group) that execute one or more software or firmware programs generated from a plurality of programming instructions, and/or other suitable components that provide the described functionality.

As used hereinafter, including the claims, the terms "sensor management system" and "navigation system" may refer to, be part of, or include one or more Application Specific Integrated Circuits (ASIC), electronic circuits, programmable combinational logic circuits (such as field programmable gate arrays (FPGA)) programmed with logic to perform operations described herein, a processor (shared, dedicated, or group) and/or memory (shared, dedicated, or group) that execute one or more software or firmware programs generated from a plurality of programming instructions with logic to perform operations described herein, and/or other suitable components that provide the described functionality.

It is noted that as a laser ages, it requires more bias current to provide a constant output power. This fact is accelerated for some types of lasers where the rate of I_bias change may be an exponential of time and temperature, resulting in rapid laser failure. Thus, in embodiments, a failure warning system may monitor laser I_bias change over time and temperature, and compare actual I_bias changes to those of standard lasers of the same type. If an abnormal change is seen, a warning signal may be sent to a user. In embodiments the warning signal may include setting a flag. In embodiments, an abnormal change in I_bias may be defined as one that exceeds the normal change in I_bias for that type of laser by a certain value, factor or percentage.

As noted above, an apparatus according to various embodiments may be provided in an optical module. An optical module may be an optical transceiver, where a laser is used in the transmitter chain. Referring now to FIG. 1, an example optical module 100 is depicted. Optical module 100 may have a laser 110 communicatively connected to each of a bias current sensor 120, an elapsed operating time detector 140, and a temperature sensor 130. Bias current sensor 120 may be communicably connected to failure warning system 150, which may include memory 159, and micro-processor 155. In embodiments, elapsed operating time detector 140 and temperature sensor 130 may each be communicably connected to EEPROM 145, which may also be communicably connected to failure warning system 150. Alternatively, optical module 100 may not include an EEPROM, in which case elapsed operating time detector 140 and temperature sensor 130 may directly write data to failure warning system 150, which may store the data in one or more memories collectively represented by memory 159. As noted above, failure warning system 150 may comprise a micro-controller, and may be implemented as a SoC. Failure warning system 150 may include processor 155, and memory 159. In embodiments, a reference model for the laser may be stored in memory 159, and, as noted, this may occur at the time of manufacture of either optical module 100 or failure warning system 150. Laser 115 may be controlled by an automatic power control (APC) unit 115. APC unit 115 may be provided within firmware of optical module 100, and, in embodiments, it may continually measure transmitter output power and adjust the laser bias current to keep the module transmitter output power constant.

FIG. 2 depicts an alternate example optical module, which may include the elements of the example optical module shown in FIG. 1, which shall not be described further (these same elements in FIG. 2 have the same last two digits of their respective index numbers as do their counterparts shown in FIG. 1). In addition to these elements, the example optical module of FIG. 2 may also have communications module 257, which may communicate over network 270 to a failure warning system server 280. In the example embodiment shown in FIG. 2, optical module may periodically transmit to failure warning system server 280 data regarding laser 210. The data may include elapsed time, temperature and I_bias. Upon receiving such data, failure warning system server 280 may revise or update the reference model for laser 210, and may use similar data from a number of other individual lasers, of the same type and construction as laser 210, to tweak, update or refine the reference model. Thus, in embodiments, failure warning system server 280 may periodically download to optical module 200 a revised reference model, so as to continually improve the accuracy of failure warning system 250. In embodiments, in addition to sending an updated reference model, failure warning system server 280 may further send a revised value for a parameter, such as $\alpha$. Such revised values may be based on collective data from several lasers of similar type and construction as laser 210, including better data regarding what value of $\alpha$ is an accurate predictor of laser failure sufficient to leave enough time remaining in the life of laser 210 for a user to remedy the situation.

Alternatively, in embodiments, there need not be any reference model stored in memory 259. Rather, the reference model may be maintained only in failure warning system server 280, and once local data for laser 210 is obtained, it may be sent over network 270 by optical module 200 to failure warning system server 280, which may perform calculations, and directly determine if a warning signal to a user of the optical module is warranted. If so, failure warning system server 280 may send such a signal to communications module 257, which may then alert a user of optical module 200.

Figure 3:
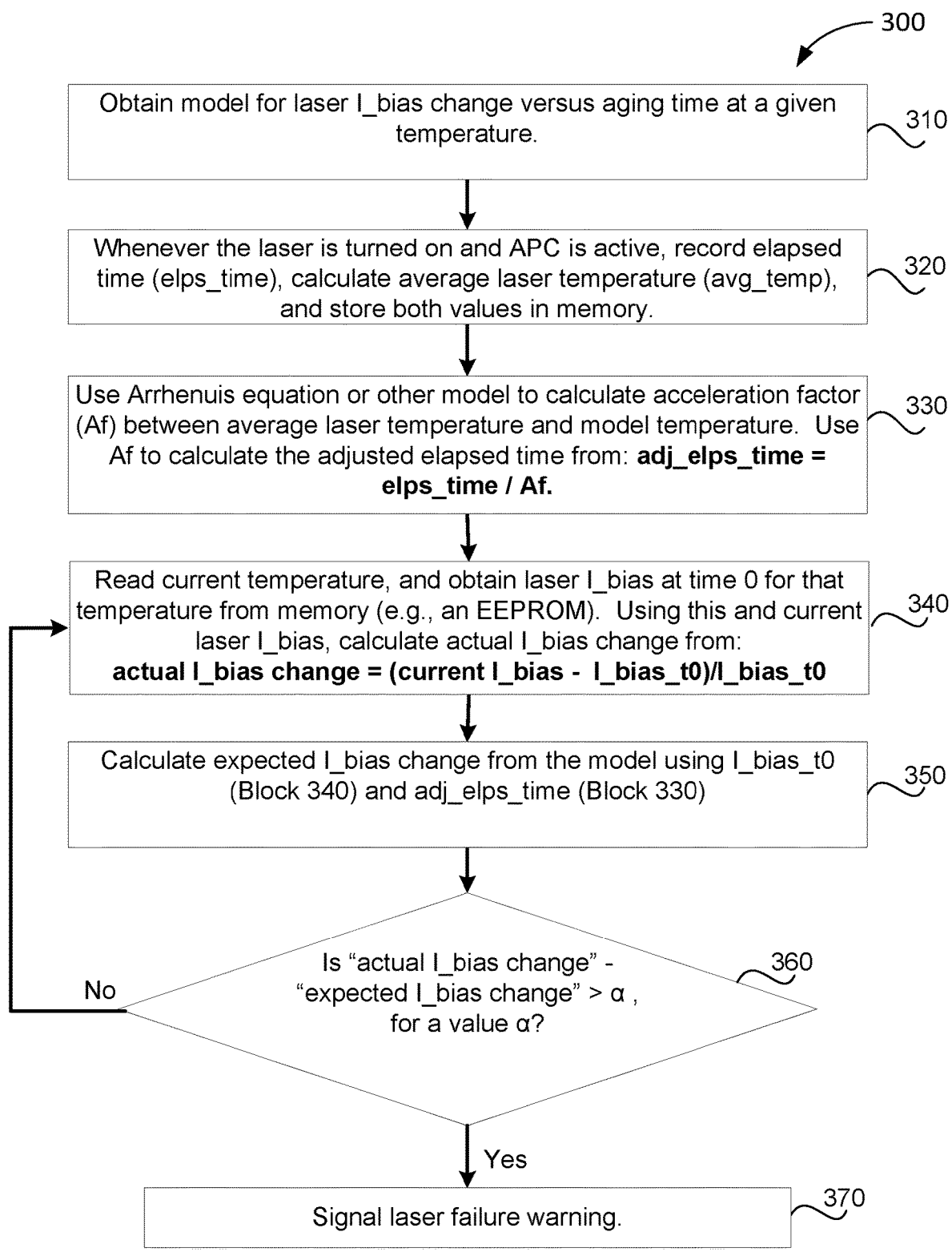
FIG. 3 illustrates an overview of the operational flow of a process for monitoring sensor data regarding a laser and calculating effective age of the laser, in accordance with various embodiments.

FIG. 3, next described, illustrates an overview of operational flow for obtaining data regarding a laser and determining, based upon that data and a reference model, whether the laser may be prematurely aging, and thus on a trajectory of premature failure.

Referring now to FIG. 3, an overview of operational flow for a process of obtaining data regarding a laser and determining, based upon that data and a reference model, whether the laser may be prematurely aging. As illustrated, process 300 may include operations performed at blocks 310-370. The operations at blocks 310-370 may be performed, e.g., by the various elements of an optical module, such as is illustrated in FIGS. 1 and 2, described above.

Process 300 may begin at block 310. At block 310 a reference model for a laser may be obtained. The reference model predicts normal I_bias change for the laser versus aging time at a given temperature. As noted above, in embodiments, the reference model may be stored in a memory of the optical module at manufacture, or, for example, it may be obtained once the optical module is already operational, such as by receiving an updated module over a data network. In embodiments, the memory may be a memory in a microcontroller or a failure warning system, such as memory 159 of FIG. 1.

Once a reference model has been obtained, process 300 may proceed to block 320, where elapsed operating time for the laser may be recorded, average laser temperature calculated, and both these values stored in a memory. This memory may be EEPROM 145 provided in an optical module, or may be memory 159, provided in a failure warning system, each as shown in FIG. 1. In embodiments, average laser temperature may be calculated as y=T(t) from t=a to t=b by the definite integral of the temperature function T(t) from t=time a to t=time b, divided by (b−a), or: $T_{average} = \int T(t)dt/(b-a)$. Alternatively, for a series of discrete time slots, the average laser temperature may be provided as:

$$\text{Average laser temparature} = \frac{\sum_{n=1}^{k}(temp\ (n) * \text{fixed time interval})}{k * \text{fixed time interval}}$$

It is noted that in embodiments, the processes of block 320 may be performed whenever the laser is turned on and the APC is active.

Process 300 may next proceed from block 320 to block 330, where an acceleration factor (Af) may be calculated between average laser temperature and model temperature. In embodiments, the Af may be calculated using the Arrhenuis equation (as illustrated below) or another model. Once the Af has been calculated, it may be used to calculate the adjusted elapsed time from: adj_elps_time=elps_time/Af.

It is here noted that the adj_elps_time value is a transposition of the elapsed time provided in the reference model, for a given operating temperature, to the actual elapsed operating time of the laser, given the laser's actual average temperature. It is thus a scaling factor, scaling up if the actual laser operates at a higher temperature than the model, or scaling down if the actual laser's average operating temperature is lower than that assumed in the model. An example calculation is provided below.

As noted above, in embodiments, laser bias current at a then operating temperature of the laser, given an elapsed operating time for the laser, may be used as a proxy or indicator of effective age of the laser. A laser that is significantly older than its actual age (i.e., elapsed operating time) would indicate may be close to failure as a result of a premature or accelerated aging, and if the rate of aging is significantly greater than a rate of aging of normal lasers of this type and construction, a user may be so advised or warned, so that remediation may occur. As described below, the concept of "significantly" is quantified in a parameter a, which may be programmable, and in general may be specific to laser type.

From block 330, process 300 may proceed to block 340, where it may read current temperature of the laser, obtain I_bias_t0 for that temperature, and calculate an actual I_bias change from: actual I_bias change=(current I_bias−I_bias_t0)/I_bias_t0. The I_bias_t0 for the current temperature may be read from memory, for example, EEPROM 145 of FIG. 1.

From block 340, process 300 may proceed to block 350, where it may calculate expected I_bias change from the model using I_bias_t0 (Block 340) and adj_elps_time (Block 330). It is noted that "expected I_bias change," is a proxy for expected laser aging.

Process 300 may next proceed from block 350 to query block 360, where it may be determined if actual I_bias change (calculated in block 340) is significantly larger than expected I_bias change (calculated in block 350). In embodiments, this metric may be a simple subtraction, as shown in block 360, where a measures how much laser bias current change (or drift) from I_bias_t0 is considered within the bounds of normal. Alternatively a may specify a maximum factor, greater than 1, by which actual I_bias change may exceed expected I_bias change. In such alternate formulation, the query at block 360 may be stated as "Is actual I_bias change>α*expected I_bias change?"

If at query block 360 the answer to the test was "Yes", then process 300 may proceed from block 360 to block 370, where a warning signal may be provided to a user. Process 300 may then terminate. However, if at query block 360 the answer to the test was "No", and there is no detection of accelerated aging for the laser, then process 300 may loop back to block 340, where expected I_bias change may once again be calculated, and process 300 may repeat blocks 340, 350 and 360, as described above. Such looping back may continue as long as the laser is turned on.

The following is an illustrative example of the calculations at blocks 330-350 of FIG. 3. It is assumed that the reference model provides a relation between I_bias and aging time for a laser for a given temperature, say 80° C. It is further assumed that for the example laser, the elapsed time is 100 hours and the average laser temperature is 50° C. (calculated as described above, in connection with FIG. 3).

At block 330 the Arrhenius equation may be used to calculate the acceleration factor (Af) between 50° C. (average laser temperature) and 80° C. (model temperature), as follows:

$$A_f = e^{\left(\frac{Ea}{k}\left\{\frac{1}{T_u} - \frac{1}{T_t}\right\}\right)}$$

In this equation k is the Boltzman constant (8.62 e−5 eV/K), Ea is activation energy, for example 0.7 Electron Volts (eV), Tu is the average laser temperature in Kelvin (K) and Tt is the model temperature in K. Given the above values, in this example Af is equal to 8.5, which means that the laser actual elapsed time needs to be scaled down by a factor of 8.5 to match the aging model to the laser. (block 330). This gives an adjusted elapsed time or adj_elps_time of 11.8 hours (100/8.5).

Next, as per block 340, the current temperature may be read and the laser I_bias_t0 may be obtained for that temperature from an EEPROM in an optical module (as noted above, this value for I_bias_t0 may be stored in the EEPROM at the time of manufacture). For this example I_bias_t0 may be assumed to be 50 milliamperes (mA). Continuing as per block 340, the current I_bias may be read or obtained from a sensor, such as bias current sensor 120 in FIG. 1. For this example it may be assumed to be 70 mA. Using the I_bias_t0 figure of 50 mA, it may be determined that the actual laser I_bias has thus increased by 40% [(70 mA−50 mA)/50 mA]*100.

Next the I_bias_t0 (50 mA) that was read from the EEPROM, and the adjusted elapsed time (11.8 hours) calculated at block 330, may be both plugged into the reference model to obtain the expected I_bias change. For example, assuming the model gives an I_bias value of 55 mA for an elapsed time of 11.8 hours, the expected I_bias change is 10%, as follows: [(55 mA−50 mA)/50 mA]*100. (block 350).

Performing the calculation at block 360 of FIG. 3, the "expected I_bias change" of 10% is subtracted from the "actual I_bias change" of 40%. The difference between "actual I_bias change" and "expected I_bias change", is thus 30%. Assuming, for the purposes of this example, that the alpha factor value set in the module is 25%, because the calculated difference is greater than alpha=25%, at block 370 of FIG. 3 a laser failure warning signal may be set.

Figure 4:
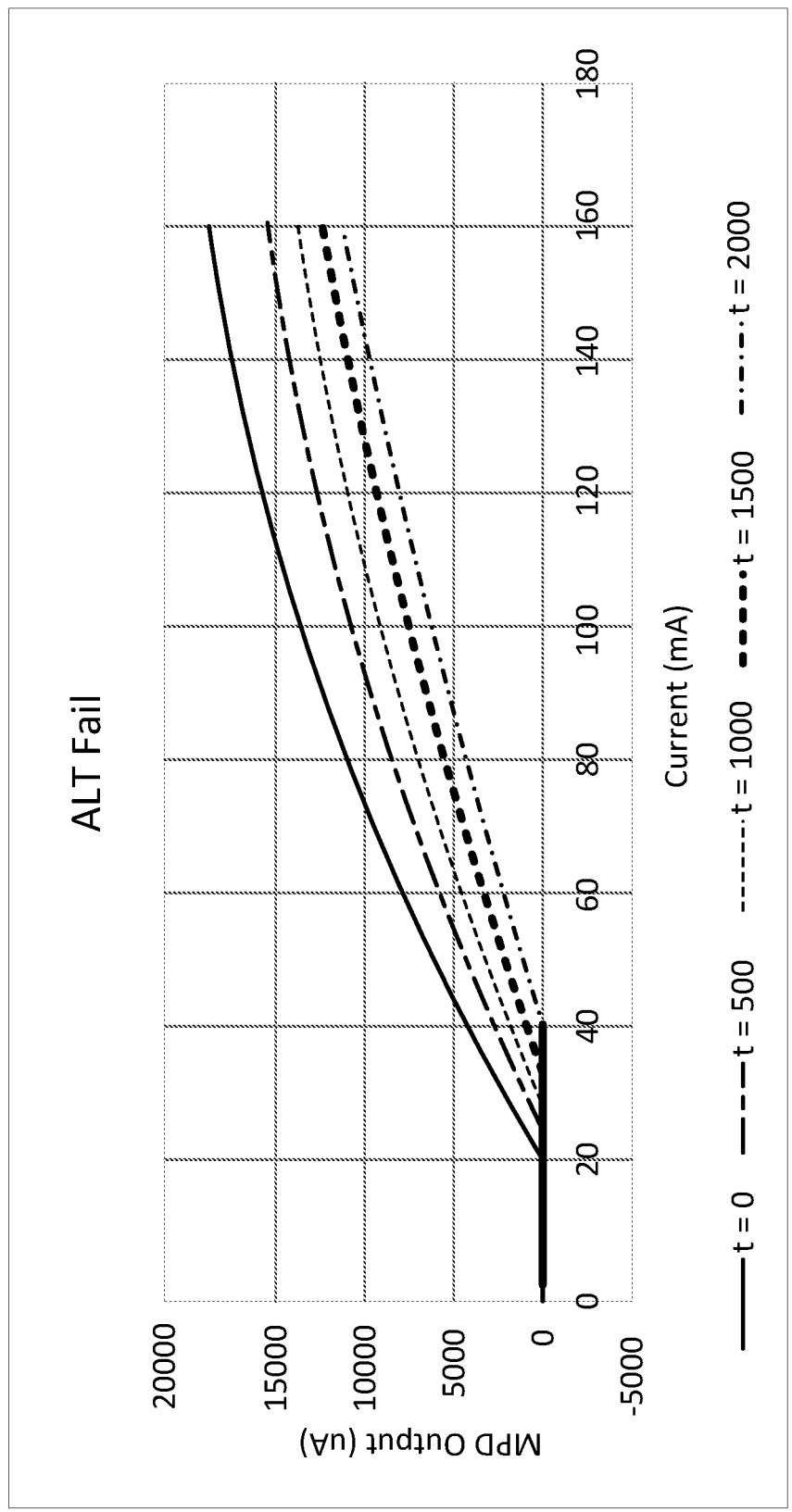
FIG. 4 depicts a plot of an example laser failing an accelerated life test.
Figure 5:
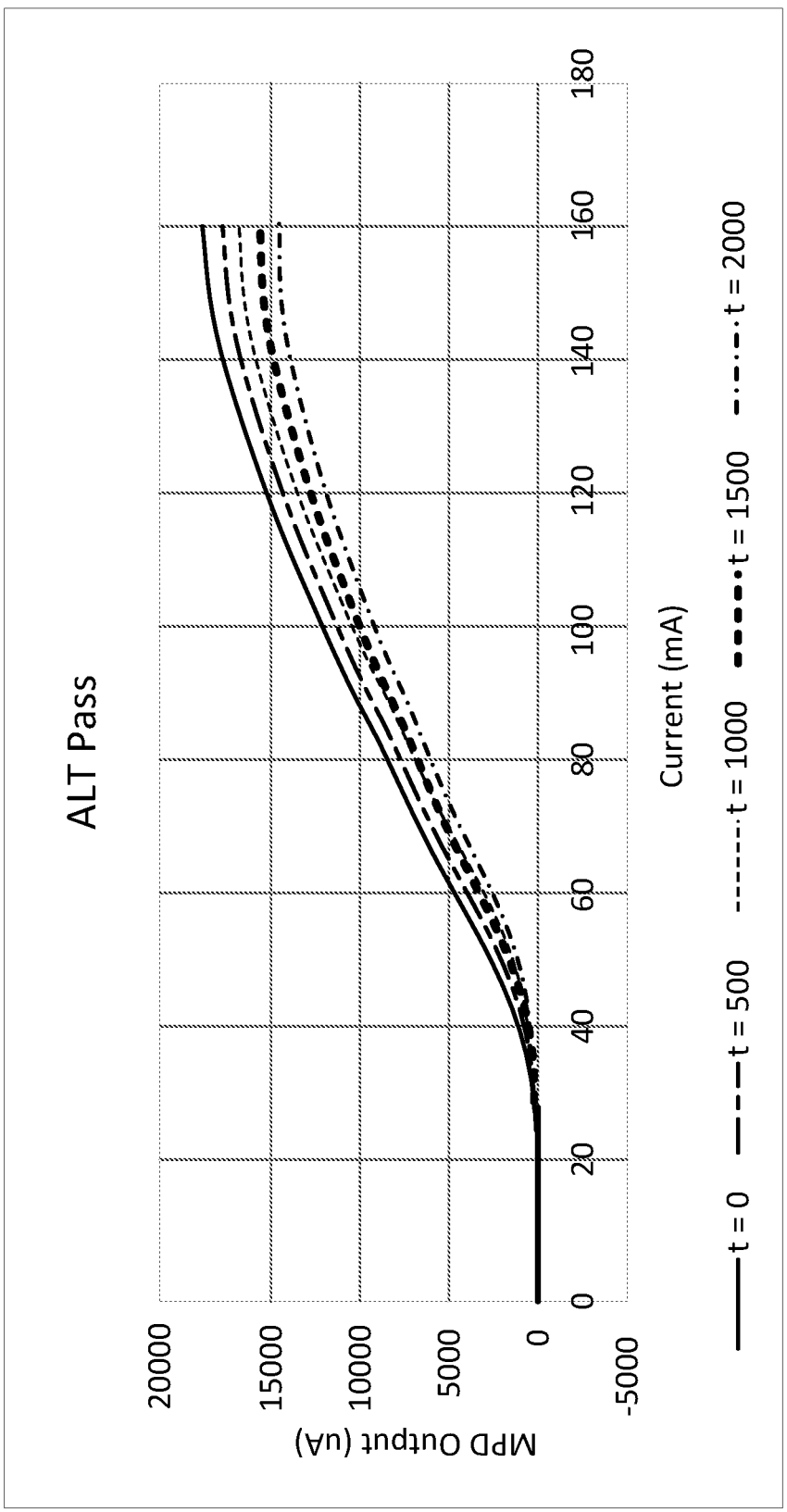
FIG. 5 depicts a plot of an example laser passing an accelerated life test.
Figure 6:
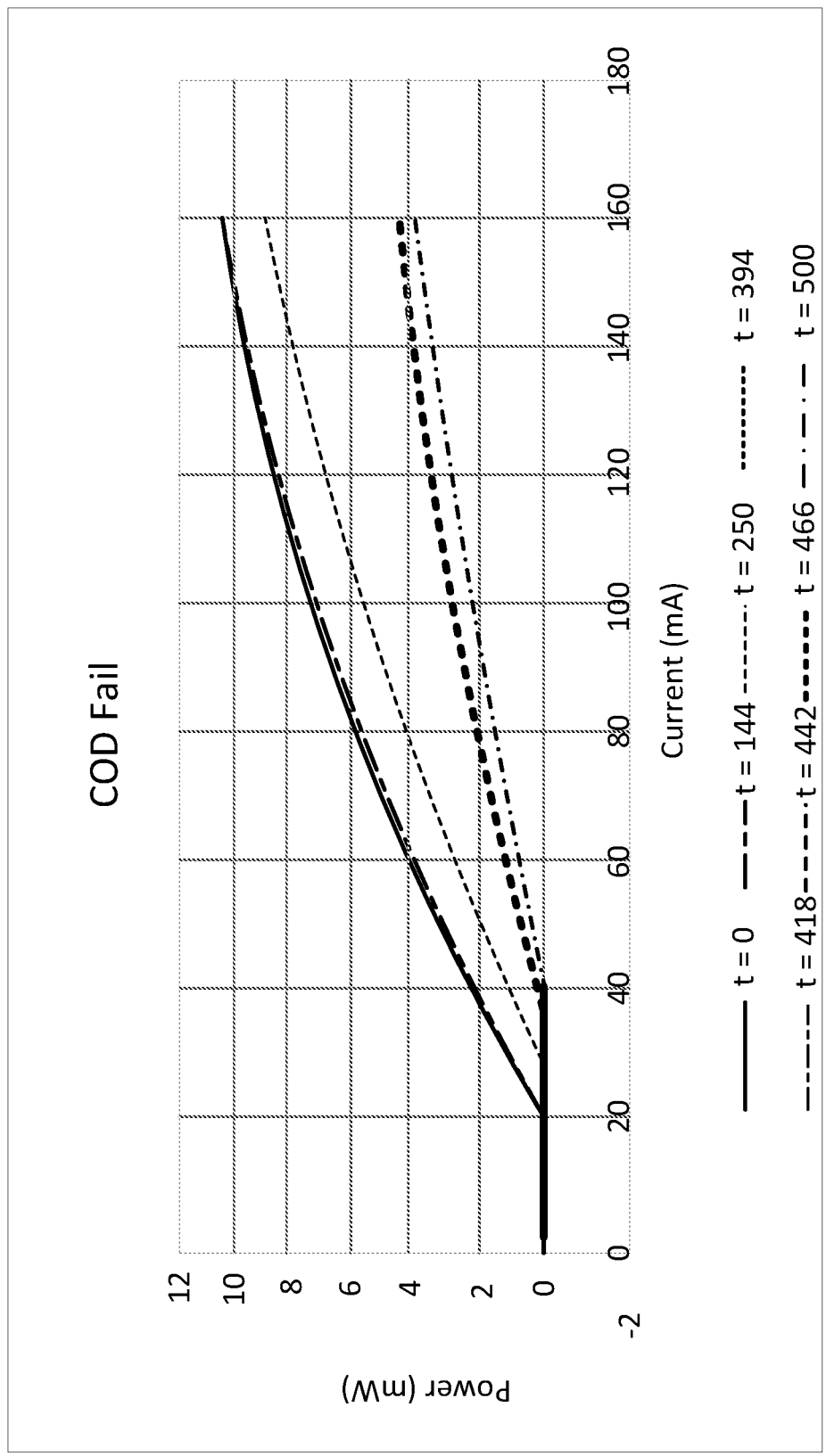
FIG. 6 depicts a plot of an example laser failing a catastrophic optical defect test.

FIGS. 4 through 7, next described, illustrate examples of lasers that would, after a given time t, either trigger a warning signal, or not trigger the warning signal, according to various embodiments. These figures show laser current variation over time for normal versus failing lasers. In each figure there are shown several plots for the same laser, but at different elapsed times of operation. FIGS. 4 and 5 show results for two lasers failing and passing, respectively, an accelerated life test (ALT). The Y-axis is a monitor photodiode (MPD) reading which is directly proportional to laser output power, and the X axis is laser bias current in milliamperes. Moreover, t stands for elapsed time in hours. Considering a given laser output power (i.e., a given MPD output) it may readily be seen that the laser current (shown in the X-axis) is growing faster for a failing laser, as shown in FIG. 5, compared to a passing laser, as shown in FIG. 6. Thus, in FIG. 5, as elapsed time increases, for the same laser bias current, a much lower output power is achieved. On the other hand, in FIG. 6, for the same laser bias current of 160 mA, the output power drops, but at a slow and near uniform rate, from t=0 to t=2000. It is noted that a failure does not necessarily mean that the laser power goes to zero; if the required laser current to maintain a given output power exceeds a maximum specification that may also be a failure.

Figure 7:
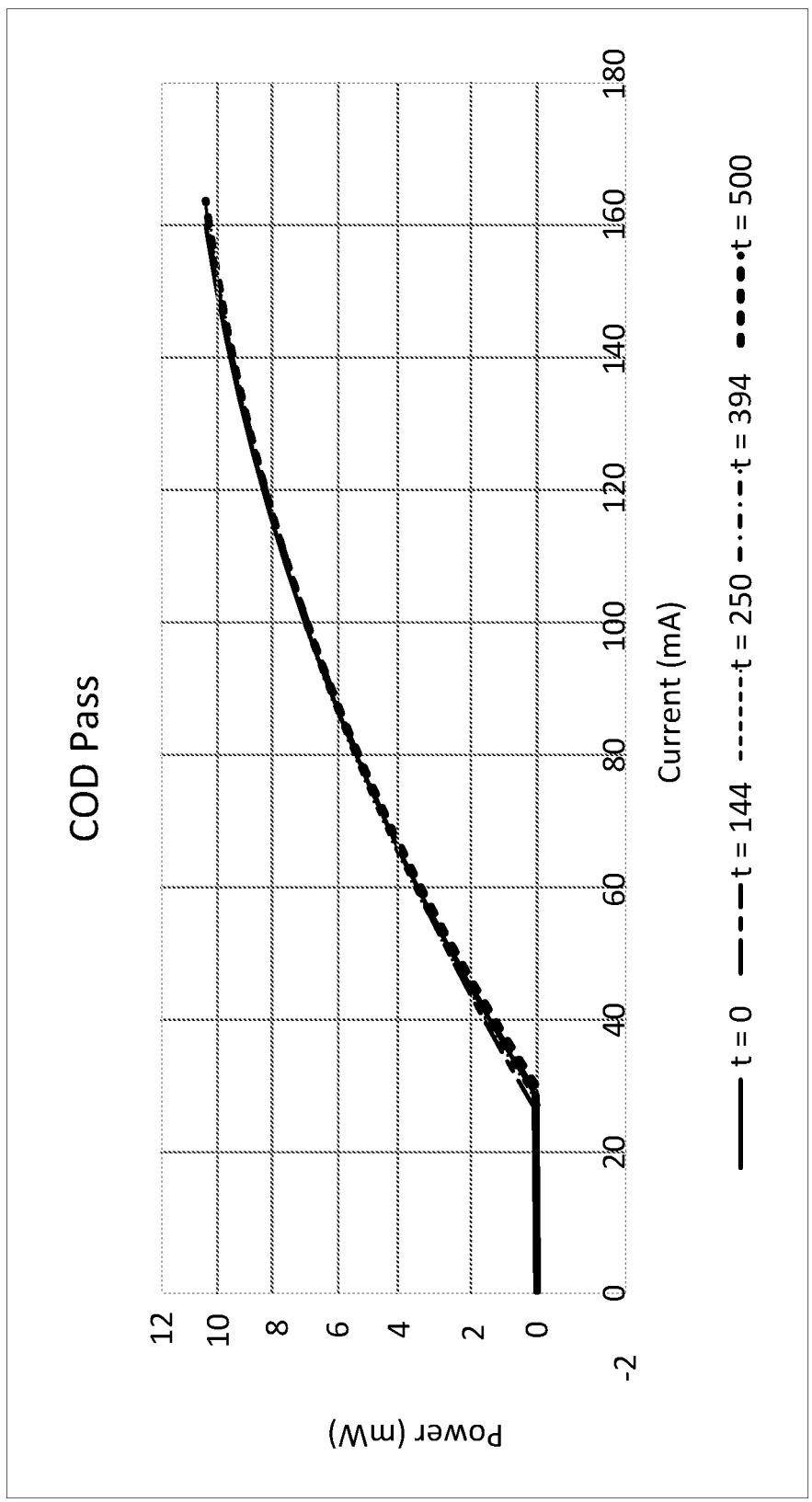
FIG. 7 depicts a plot of an example laser passing a catastrophic optical defect test.

FIGS. 6 and 7 show the results for a Catastrophic Optical Defect (COD) test. FIGS. 6 and 7 show results for two lasers failing and passing this test, respectively. The Y-axis is laser output power, and the X axis is laser bias current in milliamperes. As above, t stands for elapsed time in hours. Considering a given laser output power it may readily be seen that the laser current grows much faster for a failing laser, as shown in FIG. 6, compared to a passing laser, as shown in FIG. 7. In fact, the failing laser of FIG. 6, after 466 hours of operation (see the second from the bottom plot in FIG. 6, depicted using a half-half dashed line), for the same laser bias current of 160 mA cannot deliver even one-half of the original output power at t=0.

Another way of understanding the data of FIGS. 4 through 7 is to look at the required laser bias current to have any output power, i.e., the notch point, or bend point at the far left of the graphs where output power first rises above 0 milliwatts (mW). The farther to the right the notch point is, the higher the laser bias current required to even begin lasing. As can be seen, this laser bias current at the highest t value in each of FIGS. 5 and 7 is significantly larger than it was at t=0.

Figure 8:
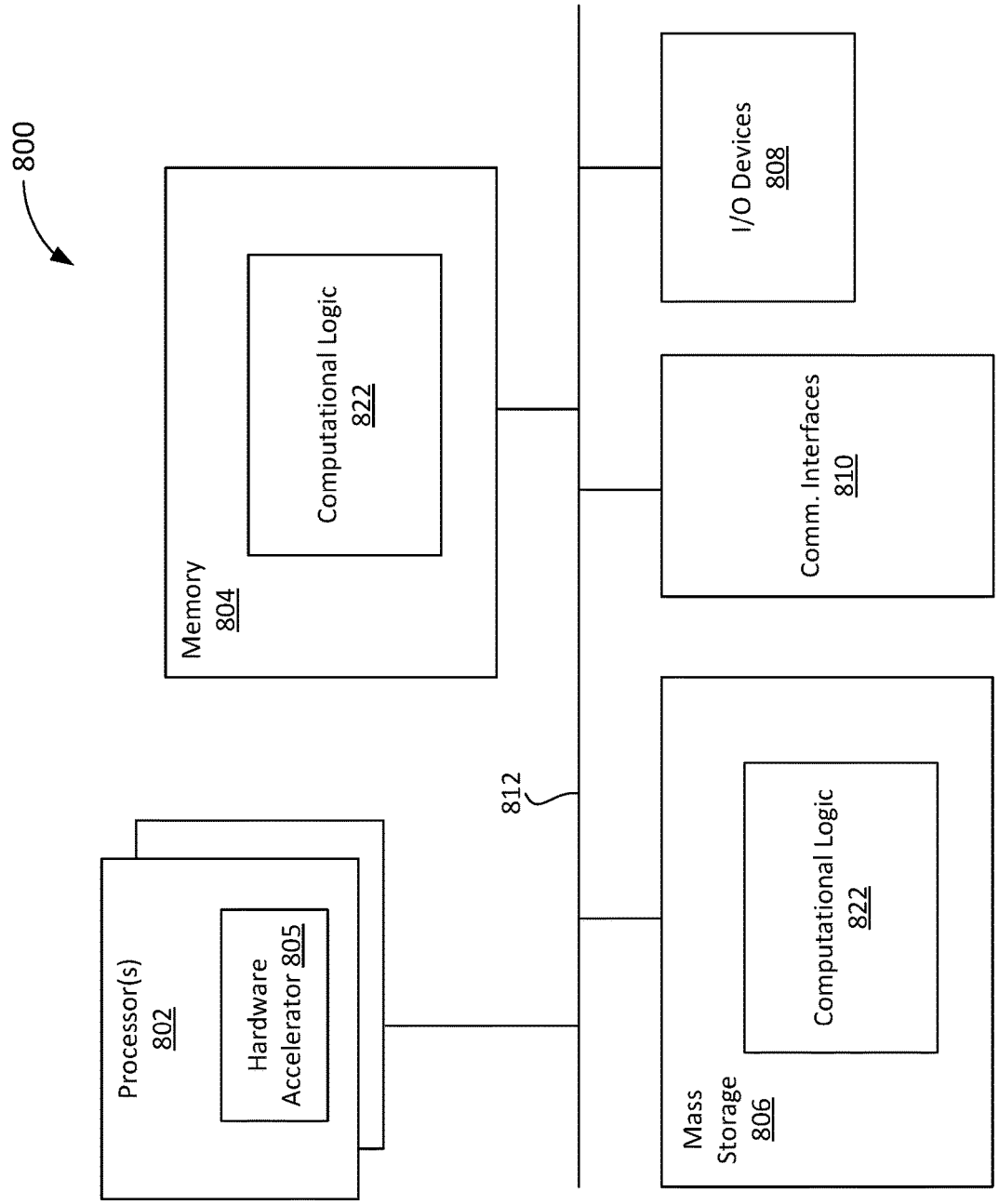
FIG. 8 illustrates a block diagram of a computer device suitable for practicing the present disclosure, in accordance with various embodiments.

Referring now to FIG. 8, wherein a block diagram of a computer device suitable for practicing the present disclosure, in accordance with various embodiments, is illustrated. As shown, computer device 800 may include one or more processors 802, memory controller 803, and system memory 804. Each processor 802 may include one or more processor cores and/or hardware accelerator 805. An example of hardware accelerator 805 may include, but is not limited to, programmed field programmable gate arrays (FPGA). Memory controller 803 may be any one of a number of memory controllers known in the art. System memory 804 may include any known volatile or non-volatile memory.

Additionally, computer device 800 may include mass storage device(s) 806 (such as solid state drives), input/output device interface 808 (to interface with various input/output devices, such as, mouse, cursor control, display device (including touch sensitive screen), and so forth) and communication interfaces 810 (such as network interface cards, modems and so forth). In embodiments, communication interfaces 810 may support wired or wireless communication, including near field communication. The elements may be coupled to each other via system bus 812, which may represent one or more buses. In the case of multiple buses, they may be bridged by one or more bus bridges (not shown).

Each of these elements may perform its conventional functions known in the art. In particular, system memory 804 and mass storage device(s) 806 may be employed to store a working copy and a permanent copy of the executable code of the programming instructions of an operating system, one or more applications, failure warning system 150, failure warning system 250, and/or failure warning system server 280, collectively referred to as computational logic 822. Failure warning system 150, failure warning system 250 and failure warning system server 280 may be configured to practice (aspects of) process 300 of FIG. 3. The programming instructions may comprise assembler instructions supported by processor(s) 802 or high-level languages, such as, for example, C, that can be compiled into such instructions. In embodiments, some of computing logic may be implemented in hardware accelerator 805. In embodiments, some of the aspects of failure warning system 150, failure warning system 250, and/or failure warning system server 280 may be implemented with hardware accelerator 805.

The permanent copy of the executable code of the programming instructions or the bit streams for configuring hardware accelerator 805 may be placed into permanent mass storage device(s) 806 in the factory, or in the field, through, for example, a distribution medium (not shown), such as a compact disc (CD), or through communication interface 810 (from a distribution server (not shown)).

The number, capability and/or capacity of these elements 810-812 may vary, depending on the intended use of example computer device 800, e.g., whether example computer device 800 is a smartphone, tablet, ultrabook, a laptop, a server, a set-top box, a game console, a camera, and so forth. The constitutions of these elements 810-812 are otherwise known, and accordingly will not be further described.

FIG. 10 illustrates an example computer-readable storage medium having instructions (or bit streams) configured to implement all (or portion of) failure warning system 150, failure warning system 250, and/or failure warning system server 280, and/or practice (aspects of) processes 300 and 400 of FIGS. 3 and 4, respectively, earlier described, in accordance with various embodiments. As illustrated, computer-readable storage medium 902 may include the executable code of a number of programming instructions or bit streams 904. Executable code of programming instructions (or bit streams) 904 may be configured to enable a device, e.g., computer device 800, in response to execution of the executable code/programming instructions (or operation of an encoded hardware accelerator 805), to perform (aspects of) process 300 of FIG. 3. In alternate embodiments, executable code/programming instructions/bit streams 904 may be disposed on multiple non-transitory computer-readable storage medium 902 instead. In embodiments, computer-readable storage medium 902 may be non-transitory. In still other embodiments, executable code/programming instructions 904 may be encoded in transitory computer readable medium, such as signals.

Referring back to FIG. 8, for one embodiment, at least one of processors 802 may be packaged together with a computer-readable storage medium having some or all of computing logic 822 (in lieu of storing in system memory 804 and/or mass storage device 806) configured to practice all or selected ones of the operations earlier described with references to FIGS. 3 and 4. For one embodiment, at least one of processors 802 may be packaged together with a computer-readable storage medium having some or all of computing logic 822 to form a System in Package (SiP). For one embodiment, at least one of processors 802 may be integrated on the same die with a computer-readable storage medium having some or all of computing logic 822. For one embodiment, at least one of processors 802 may be packaged together with a computer-readable storage medium having some or all of computing logic 822 to form a System on Chip (SoC). For at least one embodiment, the SoC may be utilized in, e.g., but not limited to, a hybrid computing tablet/laptop.

Illustrative examples of the technologies disclosed herein are provided below. An embodiment of the technologies may include any one or more, and any combination of, the examples described below.

Example 1 may include an apparatus to predict failure of a laser, comprising: a memory to store a reference model of bias current change for a laser as a function of time and temperature; one or more sensors to detect temperature, elapsed operating time and bias current of the laser; and a processor communicatively coupled to the memory and to the one or more sensors. The processor may calculate: an actual bias current change $\Delta IA$ at a current laser temperature, and an expected bias current change $\Delta IE$, based at least in part on the reference model and an average operating temperature, subtract $\Delta IE$ from $\Delta IA$, and determine if the difference exceeds a pre-defined value $\alpha$; and output a signal if the difference is greater than a.

Example 2 may include the apparatus of example 1 and/or some other examples herein, further comprising an additional memory to store an initial bias current for the laser.

Example 3 may include the apparatus of example 2 and/or some other examples herein, wherein the additional memory is an electrically erasable programmable read-only memory (EEPROM) provided in an optical module.

Example 4 may include the apparatus of example 2 and/or some other examples herein, the processor further to calculate $\Delta IA$ and $\Delta IE$ relative to the initial bias current.

Example 5 may include the apparatus of example 1 and/or some other examples herein, wherein $\alpha$ is a variable that reflects a level of risk tolerance.

Example 6 may include the apparatus of example 5 and/or some other examples herein, wherein $\alpha$ is programmable by a user.

Example 7 may include the apparatus of example 1 and/or some other examples herein, wherein the reference model of bias current change is obtained from reliability stress tests of lasers of similar type and construction to the laser.

Example 8 may include the apparatus of example 1 and/or some other examples herein, wherein calculation of the $\Delta IE$ includes calculation of the average laser temperature and, using the Arrhenius equation, a temperature acceleration factor.

Example 9 may include the apparatus of example 8 and/or some other examples herein, wherein the temperature acceleration factor is used to calculate an elapsed operating time adjusted for average laser temperature, and wherein the adjusted elapsed operating time and the reference model are used to calculate the $\Delta IE$.

Example 10 may include the apparatus of example 8 and/or some other examples herein, wherein the memory is further to store the average laser temperature and the elapsed time.

Example 11 may include the apparatus of example 8 and/or some other examples herein, wherein the average laser temperature and the elapsed time are stored in an electrically erasable programmable read-only memory (EEPROM) provided in an optical module.

Example 12 may include the apparatus of example 1 and/or some other examples herein, disposed in an optical transceiver module.

Example 13 may include one or more non-transitory computer-readable media comprising instructions that cause a laser failure monitoring system provided in an optical module, in response to execution of the instructions by the laser failure monitoring system, to: detect temperature, elapsed operating time and bias current of a laser communicatively coupled to the laser failure monitoring system; calculate: an actual bias current change $\Delta IA$ at a current laser temperature, an expected bias current change $\Delta IE$, based at least in part on an average operating temperature for the laser and a reference model of bias current change for the laser as a function of time and temperature, the model stored in the laser failure monitoring system; subtract $\Delta IE$ from $\Delta IA$, and determine if the difference exceeds a pre-defined value $\alpha$; and output a signal to a user if the difference exceeds $\alpha$, wherein the calculation of $\Delta IA$ and $\Delta IE$ are relative to an initial bias current for the laser and a current.

Example 14 may include the one or more non-transitory computer-readable media of example 13 and/or some other examples herein, wherein the initial bias current for the laser is one of: stored in a memory or obtained by the laser failure monitoring system at an initial power-on of the laser.

Example 15 may include the one or more non-transitory computer-readable media of example 14 and/or some other examples herein, wherein the initial bias current for the laser is stored in an EEPROM provided in an optical module.

Example 16 may include the one or more non-transitory computer readable media of example 13 and/or some other examples herein, wherein the reference model of bias current change is obtained from reliability stress tests of lasers of similar type and construction to the laser.

Example 17 may include the one or more non-transitory computer-readable media of example 13 and/or some other examples herein, wherein $\alpha$ is a value that reflects a level of risk tolerance.

Example 18 may include the one or more non-transitory computer-readable media of example 13 and/or some other examples herein, wherein $\alpha$ is programmable by a user.

Example 19 may include the one or more non-transitory computer-readable media of any one of examples 13-17 and/or some other examples herein, wherein, upon execution of the instructions, the laser failure monitoring system is further caused to calculate the average laser temperature and store the average laser temperature and the elapsed time in a memory.

Example 20 may include the one or more non-transitory computer-readable media of example 19 and/or some other examples herein, wherein the reference model of bias current change is obtained from reliability stress tests of lasers of similar type and construction to the laser.

Example 21 may include the one or more non-transitory computer-readable media of example 19 and/or some other examples herein, wherein calculate the ΔIE includes calculate the average laser temperature and, using the Arrhenius equation, a temperature acceleration factor.

Example 22 may include the one or more non-transitory computer-readable media of example 21 and/or some other examples herein, wherein the failure monitoring system uses the temperature acceleration factor to calculate an elapsed operating time adjusted for average laser temperature, and wherein the adjusted elapsed operating time and the reference model are used by the failure monitoring system to calculate the ΔIE.

Example 23 may include the one or more non-transitory computer-readable media of example 19 and/or some other examples herein, wherein upon execution of the instructions, the laser failure monitoring system is further caused to store the average laser temperature and the elapsed time in an electrically erasable programmable read-only memory (EEPROM) provided in an optical module.

Example 24 may include a method of monitoring a laser for an indication of failure, comprising: obtaining a reference model for a type of laser that models the change in bias current as a function of elapsed operation time and temperature; obtaining an initial bias current for the laser; monitoring a bias current, elapsed operating time and temperature of a laser of the type; calculating an expected age for the laser based, at least in part, on the elapsed operating time, an average operating temperature, and the reference model; calculating an actual age of the laser based, at least in part, on the laser temperature and the bias current of the laser; subtracting the expected age from the actual age; and if the actual age is higher than the expected age by more than a pre-defined value, sending an alarm to a user indicating that the laser is aging at an accelerated rate.

Example 25 may include the method of example 24 and/or some other examples herein, wherein calculating the expected age for the laser includes: calculating an average temperature for the laser; using the Arrhenius equation to calculate an acceleration factor between average laser temperature and reference model temperature; using the acceleration factor, calculating an adjusted elapsed time for the laser; and using the adjusted elapsed time and the initial bias current of the laser to calculate an expected bias current.

Example 26 may include the method of example 24 and/or some other examples herein, further comprising storing the laser temperature and elapsed operating time of the laser in an erasable non-volatile memory and periodically sending this data to a server.

Example 27 may include the method of example 24 and/or some other examples herein, further comprising obtaining an updated reference model and using the updated reference model for calculating the expected age of the laser.

Example 28 may include the method of example 24 and/or some other examples herein, wherein the laser is a hybrid laser disposed in an optical module.

Example 29 may include the method of example 24 and/or some other examples herein, wherein the initial bias current for the laser is provided by a manufacturer, and stored in an EEPROM at the time of manufacture.

Example 30 may include one or more computer-readable storage media comprising a plurality of instructions that in response to being executed cause a computing device to perform the method of any one of claims 24-29.

Example 31 may include an apparatus for computing, comprising means for storing a reference model of bias current change for a laser as a function of time and temperature; means for sensing to detect temperature, elapsed operating time and bias current of the laser; and means for processing communicatively coupled to the means for storing and to the means for sensing to: calculate: an actual bias current change ΔIA at a current laser temperature, and an expected bias current change ΔIE, based at least in part on the reference model and an average operating temperature, subtract ΔIE from ΔIA, and determine if the difference exceeds a pre-defined value α; and output a signal if the difference is greater than α.

Example 32 may include the apparatus for computing of example 31 and/or some other examples herein, further comprising additional means for storing to store an initial bias current for the laser.

Example 33 may include the apparatus for computing of example 32 and/or some other examples herein, wherein the additional means for storing is an electrically erasable programmable read-only memory (EEPROM).

Example 34 may include the apparatus for computing of example 32 and/or some other examples herein, the means for processing further to calculate ΔIA and ΔIE relative to the initial bias current.

Example 35 may include the apparatus for computing of example 31 and/or some other examples herein, wherein α is a variable that reflects a level of risk tolerance.

Example 36 may include the apparatus for computing of example 35 and/or some other examples herein, wherein α is programmable by a user.

Example 37 may include the apparatus for computing of example 31 and/or some other examples herein, wherein the reference model of bias current change is obtained from reliability stress tests of lasers of similar type and construction to the laser.

Example 38 may include the apparatus for computing of example 31 and/or some other examples herein, wherein calculate the ΔIE includes calculate the average laser temperature and, using the Arrhenius equation, a temperature acceleration factor.

Example 39 may include the apparatus for computing of example 38 and/or some other examples herein, wherein the temperature acceleration factor is used to calculate an elapsed operating time adjusted for average laser temperature, and wherein the adjusted elapsed operating time and the reference model are used to calculate the ΔIE.

Example 40 may include the apparatus for computing of example 38 and/or some other examples herein, wherein the means for storing is further to store the average laser temperature and the elapsed time.

Example 41 may include the apparatus for computing of example 38 and/or some other examples herein, wherein the average laser temperature and the elapsed time are stored in an additional means for storing provided in an optical module.

Example 42 may include the apparatus for computing of any one of examples 31-41 and/or some other examples herein, disposed in an optical transceiver module.

Example 43 may include an apparatus to predict failure of a laser, comprising: a memory to store a reference model of bias current change for a laser as a function of time and temperature; one or more sensors to detect temperature, elapsed operating time and bias current of the laser; a processor communicatively coupled to the memory and to the one or more sensors to: calculate: an actual bias current change ΔIA at a current laser temperature, and an expected bias current change ΔIE, based at least in part on the reference model and an average operating temperature, compare ΔIA with ΔIE, and determine if ΔIA is greater than α*ΔIE for a pre-defined factor α; and output a signal if ΔIA is greater than α*ΔIE.

Example 44 may include the apparatus of example 43 and/or some other examples herein, further comprising an additional memory to store an initial bias current for the laser.

Example 45 may include the apparatus of example 44 and/or some other examples herein, wherein the additional memory is an electrically erasable programmable read-only memory (EEPROM) provided in an optical module.

Example 46 may include the apparatus of example 44 and/or some other examples herein, the processor further to calculate ΔIA and ΔIE relative to the initial bias current.

Example 47 may include the apparatus of example 43 and/or some other examples herein, wherein α is a variable greater than 1 that reflects a level of risk tolerance.

Example 48 may include the apparatus of example 47 and/or some other examples herein, wherein α is programmable by a user.

Example 49 may include the apparatus of example 43 and/or some other examples herein, wherein the reference model of bias current change is obtained from reliability stress tests of lasers of similar type and construction to the laser.

Example 50 may include the apparatus of example 43 and/or some other examples herein, wherein calculation of the ΔIE includes calculation of the average laser temperature and, using the Arrhenius equation, a temperature acceleration factor.

Example 51 may include the apparatus of example 50 and/or some other examples herein, wherein the temperature acceleration factor is used to calculate an elapsed operating time adjusted for average laser temperature, and wherein the adjusted elapsed operating time and the reference model are used to calculate the ΔIE.

Example 52 may include the apparatus of example 50 and/or some other examples herein, wherein the memory is further to store the average laser temperature and the elapsed time.

Example 53 may include the apparatus of example 50 and/or some other examples herein, wherein the average laser temperature and the elapsed time are stored in an electrically erasable programmable read-only memory (EEPROM) provided in an optical module.

Example 54 may include the apparatus of any one of examples 43-53 and/or some other examples herein, disposed in an optical transceiver module.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. Apparatus to predict failure of a laser, comprising:
a memory to store a reference model of bias current change for a laser as a function of time and temperature;
one or more sensors to detect temperature, elapsed operating time and bias current of the laser;
a processor communicatively coupled to the memory and to the one or more sensors to:
calculate:
an actual bias current change ΔIA at a current laser temperature, and
an expected bias current change ΔIE, based at least in part on the reference model and an average laser temperature, wherein the calculation of the ΔIE includes calculation of the average laser temperature and, using the Arrhenius equation, a temperature acceleration factor, wherein the temperature acceleration factor is used to calculate an elapsed operating time adjusted for average laser temperature, and wherein the adjusted elapsed operating time and the reference model are used to calculate the ΔIE;
subtract ΔIE from ΔIA, and determine if the difference exceeds a pre-defined value α; and
output a signal if the difference is greater than α.

2. The apparatus of claim 1, further comprising an additional memory to store an initial bias current for the laser.

3. The apparatus of claim 2, the processor further to calculate ΔIA and ΔIE relative to the initial bias current.

4. The apparatus of claim 1, wherein α is a variable that reflects a level of risk tolerance.

5. The apparatus of claim 4, wherein α is programmable by a user.

6. The apparatus of claim 1, wherein the reference model of bias current change is obtained from reliability stress tests of lasers of similar type and construction to the laser.

7. The apparatus of claim 1, wherein the average laser temperature and the elapsed operating time are stored in an electrically erasable programmable read-only memory (EEPROM) provided in an optical module.

8. The apparatus of claim 1, disposed in an optical transceiver module.

9. One or more non-transitory computer-readable media comprising instructions that cause a laser failure monitoring system provided in an optical module, in response to execution of the instructions by the laser failure monitoring system, to:
detect temperature, elapsed operating time and bias current of a laser communicatively coupled to the laser failure monitoring system;
calculate:
an actual bias current change ΔIA at a current laser temperature,
an expected bias current change ΔIE, based at least in part on an average temperature for the laser and a reference model of bias current change for the laser as a function of time and temperature, the model stored in the laser failure monitoring system;
subtract ΔIE from ΔIA, and determine if the difference exceeds a pre-defined value α; and
output a signal to a user if the difference exceeds α,
wherein the calculation of ΔIA and ΔIE are relative to an initial bias current for the laser, wherein the calculation of the ΔIE includes calculation of the average laser temperature and, using the Arrhenius equation, a temperature acceleration factor, wherein the temperature acceleration factor is used to calculate an elapsed operating time adjusted for average laser temperature, and wherein the adjusted elapsed operating time and the reference model are used to calculate the $\Delta$IE.

10. The one or more non-transitory computer-readable media of claim 9, wherein the initial bias current for the laser is one of: stored in a memory or obtained by the laser failure monitoring system at an initial power-on of the laser.

11. The one or more non-transitory computer-readable media of claim 10, wherein the initial bias current for the laser is stored in an EEPROM provided in an optical module.

12. The one or more non-transitory computer readable media of claim 9, wherein the reference model of bias current change is obtained from reliability stress tests of lasers of similar type and construction to the laser.

13. The one or more non-transitory computer-readable media of claim 9, wherein $\alpha$ is a value that reflects a level of risk tolerance.

14. The one or more non-transitory computer-readable media of claim 9, wherein, upon execution of the instructions, the laser failure monitoring system is further caused to calculate the average laser temperature and store the average laser temperature and the elapsed operating time in a memory.

* * * * *